(12) United States Patent
Hinton et al.

(10) Patent No.: US 11,507,153 B2
(45) Date of Patent: Nov. 22, 2022

(54) MICROGAP SYSTEM FOR COOLING ELECTRONICS WITH DIRECT CONTACT

(71) Applicant: HYPERTECHNOLOGIE CIARA INC., Montreal (CA)

(72) Inventors: Michael Hinton, Montreal (CA); Laurent Mydlarski, Dollard-des-Ormeaux (CA)

(73) Assignee: HYPERTECHNOLOGIE CIARA INC., Montreal (CA)

( * ) Notice: Subject to any disclaimer, the term of this patent is extended or adjusted under 35 U.S.C. 154(b) by 0 days.

(21) Appl. No.: 17/614,047

(22) PCT Filed: Jun. 23, 2020

(86) PCT No.: PCT/CA2020/050871
§ 371 (c)(1),
(2) Date: Nov. 24, 2021

(87) PCT Pub. No.: WO2020/257923
PCT Pub. Date: Dec. 30, 2020

(65) Prior Publication Data
US 2022/0253112 A1   Aug. 11, 2022

Related U.S. Application Data

(60) Provisional application No. 62/867,466, filed on Jun. 27, 2019.

(51) Int. Cl.
*G06F 1/20* (2006.01)
*H05K 7/20* (2006.01)

(52) U.S. Cl.
CPC .......... *G06F 1/20* (2013.01); *H05K 7/20272* (2013.01); *H05K 7/20327* (2013.01)

(58) Field of Classification Search
CPC ...... G06F 1/20; G06F 1/203; G06F 2200/201; H05K 7/20772; H05K 7/20272;
(Continued)

(56) References Cited

U.S. PATENT DOCUMENTS 4,928,207 A * 5/1990 Chrysler ............... H01L 23/427
257/E23.093
5,285,351 A    2/1994 Ikeda
(Continued)

FOREIGN PATENT DOCUMENTS

EP    3096352 B1    2/2018

*Primary Examiner* — Adam B Dravininkas
(74) *Attorney, Agent, or Firm* — Benoit & Cote Inc.; Charles-André Caron

(57) ABSTRACT

A device for cooling a processor which comprises a chamber which is bottomless and having a perimeter sealably mounted directly on a surface of a processor; a microgap plate, separate from the chamber, which is installed at a bottom of the chamber and forms a microgap with the surface of a processor; and a lid, separate from the chamber, which is installed onto the chamber to close a top of the chamber, the lid comprising downward projections to urge the microgap plate to the bottom of the chamber during installation. Walls forming the downward projections of the lid form a lining conforming to an inner surface of walls of the chamber, wherein the lid and the downward projections thereof together form a bottomless enclosure that defines an inlet plenum volume for receiving the coolant. The microgap comprises a central inlet through the microgap plate for coolant flow into the microgap.

20 Claims, 4 Drawing Sheets

(58) Field of Classification Search
CPC ........... H05K 7/20327; H05K 7/20254; H05K 7/20809; H01L 23/473; H01L 23/4006
See application file for complete search history.

(56) References Cited

U.S. PATENT DOCUMENTS

| | | | |
|---|---|---|---|
| 6,973,801 B1 | 12/2005 | Campbell et al. | |
| 7,120,021 B2 | 10/2006 | Hamman | |
| 7,551,439 B2 | 6/2009 | Peugh et al. | |
| 7,913,751 B2 | 3/2011 | Zwittig | |
| 9,131,631 B2 | 9/2015 | Joshi | |
| 9,448,278 B2* | 9/2016 | Schroeder | G01R 31/2642 |
| 9,835,363 B2 | 12/2017 | Xiao et al. | |
| 10,561,040 B1* | 2/2020 | Lunsman | H05K 7/20272 |
| 2002/0163782 A1* | 11/2002 | Cole | H05K 7/20345 361/700 |
| 2002/0185260 A1* | 12/2002 | Calaman | F28F 3/12 257/E23.098 |
| 2004/0104012 A1 | 6/2004 | Zhou et al. | |
| 2005/0183844 A1 | 8/2005 | Tilton et al. | |
| 2005/0185378 A1* | 8/2005 | Tilton | H05K 7/20345 361/699 |
| 2005/0219815 A1 | 10/2005 | Lee et al. | |
| 2006/0104031 A1 | 5/2006 | Colgan et al. | |
| 2006/0126296 A1 | 6/2006 | Campbell et al. | |
| 2006/0180300 A1 | 8/2006 | Lenehan et al. | |
| 2006/0185829 A1* | 8/2006 | Duan | H01L 23/473 257/E23.098 |
| 2007/0050980 A1* | 3/2007 | Vetter | B23K 11/14 257/E23.098 |
| 2007/0163750 A1 | 7/2007 | Bhatti et al. | |
| 2007/0274045 A1* | 11/2007 | Campbell | H01L 23/4735 165/80.4 |
| 2010/0053890 A1 | 3/2010 | Brunschwiler et al. | |
| 2010/0103620 A1 | 4/2010 | Campbell et al. | |
| 2012/0103575 A1* | 5/2012 | Tang | H01L 23/473 165/104.31 |
| 2012/0106083 A1 | 5/2012 | Toftl.oekke et al. | |
| 2013/0139998 A1 | 6/2013 | Hayashi et al. | |
| 2014/0085823 A1* | 3/2014 | Campbell | H05K 7/20 361/689 |
| 2015/0285857 A1* | 10/2015 | Schroeder | G01R 31/2875 324/750.08 |
| 2016/0118317 A1 | 4/2016 | Shedd et al. | |
| 2019/0246518 A1 | 8/2019 | Shen et al. | |

* cited by examiner

MICROGAP SYSTEM FOR COOLING ELECTRONICS WITH DIRECT CONTACT

CROSS-REFERENCE TO RELATED APPLICATIONS

This application claims the priority or benefit of U.S. provisional patent application 62/867,466, filed Jun. 27, 2019, the specification of which is hereby incorporated herein by reference in its entirety.

BACKGROUND

(A) Field

The subject matter disclosed generally relates to cooling devices for electronics. More specifically, it relates to a system using single-phase or two-phase fluid flow in a microgap to cool down electronics with direct contact.

(b) Related Prior Art

Most existing microprocessor cooling devices that use a coolant to transfer the heat away require a cold plate between the microprocessor surface (which is hot) and the coolant. Furthermore, this setup requires a thermal interface material between the two solid surfaces to overcome the thermal contact resistance which would otherwise be significant. These additional layers between the processor surface and the coolant reduce the heat transfer effectiveness, and are not strictly necessary for some cooling technologies.

Some devices involve direct contact of the coolant against the processor surface, but typically require significant integration with the remaining system.

For example, U.S. Pat. No. 6,943,444 describes a cross-flow microgap with direct coolant contact with a processor. Furthermore, the document describes additional embodiments that add heat transfer enhancing structures to the microgap top (unheated) surface or microgap bottom (heated processor) surface. However, this device and other existing microgap devices suffer from various drawbacks that will be described below.

SUMMARY

According to an embodiment, there is provided a device for cooling a processor, the device comprising: a chamber which is bottomless and has a perimeter sealably mounted directly on a surface of the processor; a microgap plate, separate from the chamber, which is installed at a bottom of the chamber and forms a microgap with the surface of a processor; and a lid, separate from the chamber, which is installed onto the chamber to close a top of the chamber, the lid comprising downward projections to urge the microgap plate to the bottom of the chamber during installation.

According to an aspect, the downward projections of the lid comprise side walls.

According to an aspect, the side walls of the downward projections of the lid are joined at edges thereof and form a lining conforming to an inner surface of walls of the chamber, wherein the lid and the downward projections thereof together form a bottomless enclosure.

According to an aspect, the bottomless enclosure formed by the lid and the downward projections thereof defines an inlet plenum volume for receiving coolant.

According to an aspect, the lid further comprises a central inlet which opens to the inlet plenum volume.

According to an aspect, the microgap plate comprises a microgap central inlet permitting flow of coolant between the inlet plenum volume and the microgap.

According to an aspect and in combination with any of the preceding features, the device further comprises an outlet plenum away from the microgap and at a bottom of the chamber which is bottomless, the outlet plenum being thereby limited at a bottom by the processor, the outlet plenum comprises an outlet.

According to an aspect and in combination with any of the preceding features, the chamber comprises a seat in a bottom portion of the chamber, the seat protruding inwardly from the inner surface of walls of the chamber, the microgap plate being seated on said seat.

According to an aspect, the device further comprises another internal sealing member at an interface between the seat and a portion of the microgap plate seated on the seat.

According to an aspect and in combination with any of the preceding features, the device further comprises an internal sealing member at an interface between bottom edges of the downward projections of the lid and a portion of the microgap plate onto which said downward projections of the lid urge.

According to an aspect and in combination with any of the preceding features, the microgap has a height between 1 µm and 1 mm.

According to an aspect, the microgap has a height between 50 µm and 500 µm.

According to an aspect and in combination with any of the preceding features, the device further comprises micropin/fins at a bottom of the microgap plate to enhance heat transfer in the microgap.

According to an aspect, the micropin/fins extend downwardly from a bottom of the microgap plate, have a height which is between 50 µm and 500 µm and extend through the microgap along a height thereof.

According to an aspect and in combination with any of the preceding features, the lid further comprises a central inlet which opens to an inside volume of the chamber, within the lid and the downward projections thereof.

According to an aspect, the microgap plate comprises a microgap central inlet permitting flow of coolant from the inside volume of the chamber to the microgap.

According to an aspect and in combination with any of the preceding features, the device further comprises a central inlet in the lid providing an inlet for coolant into the chamber and into side outlet plenums in opposite side walls of the chamber providing an outlet for the coolant from the microgap.

According to an aspect and in combination with any of the preceding features with the exception of the features of the preceding paragraph, the device further comprises a side inlet and a side outlet in opposite side walls of the chamber for coolant inlet in the microgap and outlet from the microgap, respectively.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Figure 1:
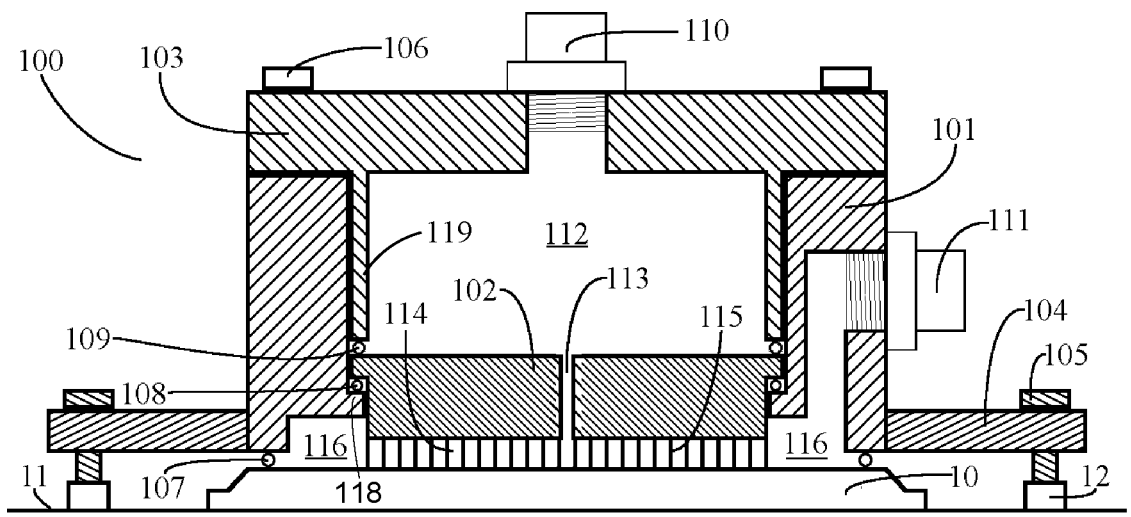
FIG. 1 is a side cross-section illustrating a device for cooling comprising a central inlet microgap and micropin/fins, according to an embodiment of the invention.

The devices discussed in the prior art section above do not offer a method for easily being applied to any standard processor or connecting with existing cooling device connection mechanisms.

After examining the device described in U.S. Pat. No. 6,943,444, it appears that there are several drawbacks to the teachings found in that document. The device disclosed therein does not include any integration, attachment (connection) or sealing methods. This device cannot be easily applied to the processors of existing systems, i.e., it is not suitable for retrofitting. Installation would be complex, and would likely require a custom system to accommodate the device. Furthermore, cleaning, maintaining and removing the device would be complicated or impossible.

Moreover, that document (U.S. Pat. No. 6,943,444) only describes a cross flow configuration, where the coolant passes from one side to the opposite side. This flow configuration can result in severely nonuniform temperature profiles across the surface of the processor, and thus adversely affect operation of the processor. Contrarily to the invention described further below, it does not cover central inlet flow configurations, for example radial flow (FIG. 4) or split flow (FIG. 5). Central inlet flow configurations, as contemplated herein, improve temperature uniformity across the processor surface, target the hottest area (the center) first with the coldest coolant, and result in lower pressure drop due to the reduced flow path length. Split flow also shares these benefits as it focuses on the central area of the processor surface.

Furthermore, U.S. Pat. No. 6,943,444 fails to teach a heat transfer enhancement option, in particular micropin/fins at the top (unheated) surface of the gap. It does include the deposition of micropin/fins on the bottom (heated/processor) surface of the gap. However, deposition of micropin/fins onto an existing processor is very impractical and not possible in some cases. Furthermore, the micropin/fins are then not technically part of the cooling device. Adding micropin/fins to the actual cooling device during its manufacturing is much more practical.

According to an embodiment of the invention, the microgap cooling device comprises three main components: the microgap plate; the chamber; and the lid. There will be described below (especially in relation to FIGS. 1, 3, 8 and 9) different implementations of these three components.

Generally speaking, i.e., in relation with every embodiment of the invention such as in FIGS. 1, 3, 8 and 9, the chamber comprises chamber connectors which connect to the processor's standard microprocessor cooling device mechanical connections, for installation onto the microprocessor, including in a context of retrofitting, and a sealing member (e.g., O-ring) seals it along the perimeter of the processor surface. The chamber is bottomless (i.e., open at the bottom), thereby allowing direct contact of the cooling fluid with the processor surface, without leakage thanks to the sealing on the perimeter.

Again, for all embodiments of the invention, such as in FIGS. 1, 3, 8 and 9, the microgap plate 102 is placed inside the chamber on top of a seat 118 comprising an internal sealing member 108 at the interface between the bottom edge of the microgap plate 102 and the seat 118 which belongs to the chamber 101. The seat 118 is an inward lateral projection forming a shoulder or seat and protruding inwardly from the inner side walls of the chamber 101 at or close to a bottom thereof and on which the side edges of the microgap plate 102 is installed (and sealed with the internal sealing member 108). The downward projections 119 of the lid 103 can urge onto the same edges of the microgap plate 102 (or elsewhere on the microgap plate 102) to have the microgap plate 102 rest and be well seated onto the seat comprising the internal sealing member 108. The internal sealing member 109 seals this junction between different elements, e.g., the interface where the bottom edge of the downward projections 119 of the lid 103 urge onto the upper surface of the edges of the microgap plate 102, right above the inward seat on which the microgap plate 102 and where it is also sealed by the other internal sealing member 108.

According to an embodiment, and as shown in FIG. 1, the microgap plate 102 comprises an array of micropin/fins 115. The micropin/fins 115 are included to enhance heat transfer, but they additionally act as standoff pins to create a microgap 114 of predetermined height above the processor surface. If additional standoff structures/pins with the predetermined height are included, then the height of the micropin/fins can be equal to or less than the predetermined height of the microgap 114.

The expected range for predetermined height of the microgap 114 is between 1 µm and 1 mm (1,000 µm), hence the term "microgap" to refer to the gap formed by the micropin/fins 115 and defined from the bottom end thereof to the processor surface. Smaller heights are preferred, as the heat transfer performance generally improves as the height is reduced. However, the difficulties in terms of fabrication and application typically limit the height to above 50 µm. Therefore, typically, the predetermined height of the microgap 114 is between 50 µm and 500 µm. The micropin/fins 115 have a length consistent with the height of the microgap in which they extend (i.e., not longer than said height).

The lid 103 is then placed on and fastened to the top of the chamber. Modification to the geometry and mating of the components of the multi-piece design can ensure compatibility with a wide range of potential processor surfaces (e.g. elevated perimeter edges with a recessed central cooling area, and vice-versa), and conformation to different processor surface curvatures. The lid 103 additionally has a feature to press the microgap plate 102 down along its perimeter.

FIG. 1 shows projections 119 which form an integral part of the lid 103 and extend downwardly from the body of the lid 103 and reach the top surface of the microgap plate 102, thereby ensuring that a downward movement of the lid 103 and its projections 119 result in pushing the microgap plate 102 downwardly too.

The projections 119 are walls which extend downwardly from the lid 103 and which conform with the inner surface of the walls of the chamber 101 and form a lining with the chamber 101 along its walls, in addition to providing a lid as such, thereby enclosing the inside of the chamber 101, without any bottom (i.e., forming a bottomless enclosure defining an inner volume for receiving the coolant), keeping the bottom of the chamber open onto the microgap plate 102. For example, the projections 119 can comprise four walls which are joined at the edges and which are perpendicular with each adjacent wall, forming the sides of a prism (cube or rectangular prism) or more generally a bottomless box which has outer dimensions that are the same as the inner dimensions of the prism (cube or rectangular prism) formed by the walls of the chamber 101 (also four walls which are joined at the edges and which are perpendicular with each adjacent wall). When viewed from the top, the projections 119 together form a square or a rectangle, the outer dimensions (width, length) of which are very slightly smaller than the corresponding dimensions of the inside of the chamber 101 (inner surface of the side walls), which has the same shape when viewed from the top (e.g., square or rectangle). The dimensions of the shape that the projections 119 make when viewed from the top match those of the microgap plate 102, as shown in FIG. 1 where the width between the outer surface of opposed projections 119 is the same as the width of the microgap plate 102 below that it helps maintaining in place onto the processor 10. The shape given as an example (square or rectangle and corresponding prism when including depth) is given as an example, without limitation, as other shapes are possible as long as they are consistent with the processor 10 being cooled down.

In all embodiments, a third sealing member 107 between the bottom surface of the chamber 101 (more precisely, on the bottom contour thereof) and the top surface of the processor 10 ensures that the entire coolant path of the device 100 is hermetically sealed against the processor surface.

During operation, coolant enters through an inlet 110 in the lid 103, where it subsequently passes through a central inlet hole in the microgap plate 102, as shown in FIG. 1. Then, the coolant flows radially outward through the microgap 114, and in the process cools the processor 10 by single- or two-phase convective heat transfer. The heated coolant passes out of the microgap 114 into a larger volume plenum 116 along the inner perimeter of the chamber, where it collects and exits the device 100 through an outlet 111 in the chamber wall.

Figure 2:
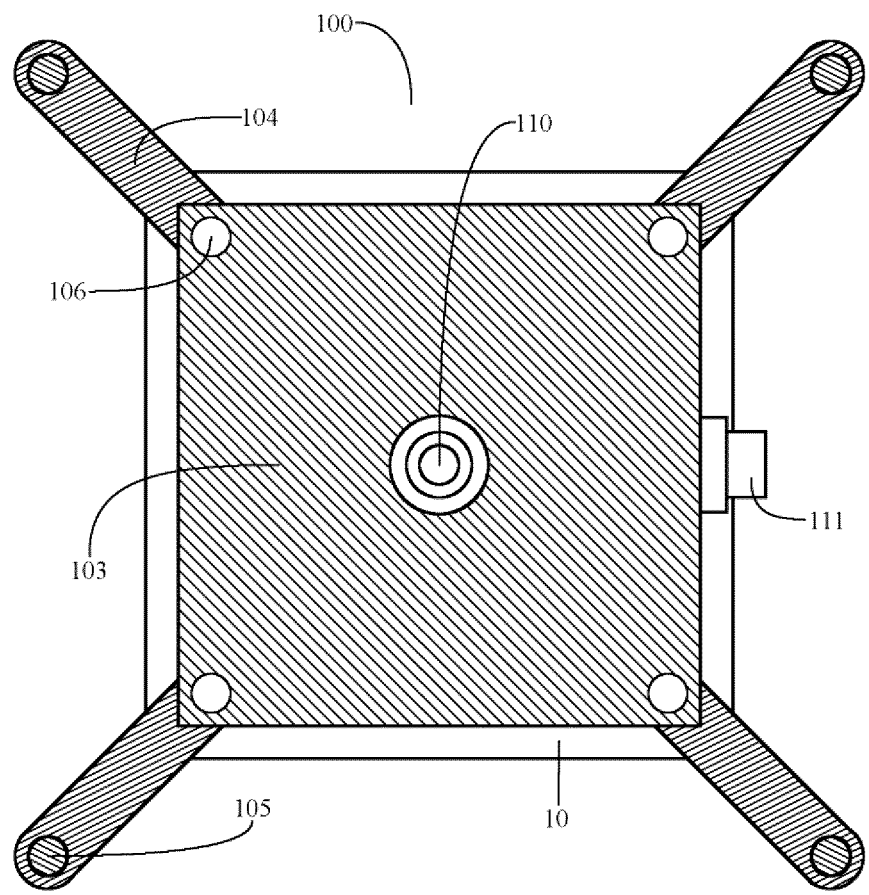
FIG. 2 is a top view illustrating the device of FIG. 1.

Now referring specifically to the embodiment shown in FIGS. 1-2, a cooling device 100 will be described that can be mounted to an existing or standard processor and motherboard without any modification to that system. Furthermore, the device 100 hermetically seals to the processor surface to allow direct contact liquid cooling, and is constructed in a way to facilitate cleaning, maintaining and removing the device 100 without any risk of coolant leakage, which makes the system very practical. The device 100 uses a central inlet radial flow cooling method that improves temperature uniformity, targets the hottest area (the centre) first with the coldest coolant, and results in lower pressure drop. Finally, in one of the embodiments, the microgap has micropin/fins, which enhance the heat transfer. Moreover, they are included as part of the microgap plate 102 of the actual device, rather than as part of the processor surface, thus making the device 100, again, very practical in terms of cleaning, maintaining and removal without any risk of coolant leakage.

Referring to FIG. 1, there is shown a cooling device 100 mounted on a processor 10. According to this embodiment, the cooling device 100 is a three-part device comprising: a chamber 101, a microgap plate 102, and a lid 103.

The processor system can be defined as the assembly that contains the processor 10, which is attached to a circuit board 11, and the system provides standard cooling device connection points 12. The processor surface on which the cooling device 100 is mounted could be the processor die or a heat spreading processor lid, typically referred to as an integrated heat spreader (IHS). It should be noted that the term processor, could refer to microprocessor, central processing unit (CPU), general/graphical processing unit (GPU), or any other processing device. Furthermore, in typical computer systems, circuit board refers to the motherboard.

As described further below, the cooling device mounts to the processor surface in a way such that the coolant can flow directly over the surface through a microgap. This allows for very effective heat transfer because the thermal resistances of the cold plate and thermal interface material, as well as multiple thermal contact resistances, are removed. When connected, the cooling device 100 and the processor surface create a hermetically sealed enclosure and flow path for the coolant. This prevents the coolant, which is a fluid, from leaking onto any electrical connections of the processor system, and potentially causing an electrical short. Since the cooling surface of a processor is usually electrically insulated, there is no requirement for specialty dielectric coolants. However, dielectric coolants can certainly be used. Furthermore, it should be noted that the term coolant refers to any type of coolant, including refrigerants.

The cooling device 100 comprises a chamber 101, a microgap plate 102, and a lid 103, which, when connected together by the lid fastener 106, and sealed by a first sealing member 108 and a second sealing member 109, form an enclosure with a bottom opening. The lid fastener 106 can be provided at corners of the lid 103 and chamber 101, as shown in FIG. 2. When this device is connected to the standard cooling device connection points 12 with the chamber connection arms 104 and the device fasteners 105, and sealed to the processor surface with a third sealing member 107, a hermetically sealed enclosure is created for the coolant. This three-piece device has a simple and safe removal process because the lid 103 and microgap plate 102 can be removed from the remaining portions of the device 100 prior to removing the chamber 101 from the processor 10, thus preventing coolant leakage onto the circuit board 11. Also, the separate parts facilitate cleaning and maintenance of the device. Furthermore, it simplifies manufacturing. Lastly, it makes swapping out microgap plates simple, and swapping in newer or custom microgap plates possible, without replacing the lid and chamber 101 in the process.

In another embodiment, the connecting arms 104 can be separate from the chamber 101, and instead be part of a separate connector piece that forms the connection between the standard cooling device connection points 12 and the chamber 101.

Figure 7:
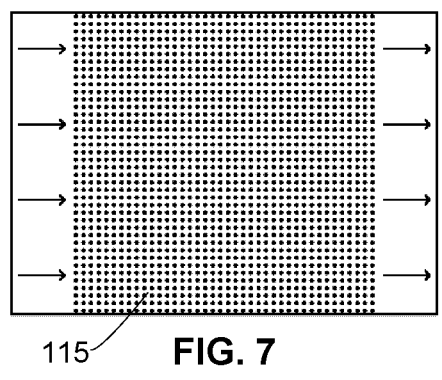
FIG. 7 is a top view illustrating a configuration with a side inlet cross flow with micropin/fins, according to an embodiment of the invention.

During operation, coolant is pumped through a central lid inlet 110 into an inlet plenum 112, which is the inside volume of the chamber 101, or more specifically inside the bottomless enclosure defined within the inner lining formed by the projections 119 and below the lid 103 from which the projections extend, which ensure that the inner walls of the chamber 101 are not even in direct contact with the coolant. The central location refers to an inlet located in at the center of the lid 103 as seen from the top, as shown very clearly in FIG. 2. The coolant is then forced through a microgap central inlet 113 in and through the microgap plate 102, and it flows into the microgap 114. The coolant flows radially through the microgap 114 (the radial flow being shown in FIG. 4), and in the process absorbs heat from the processor 10, and, in two-phase cooling, can be vaporized (this would depend on the actual fluid used as a coolant and on the range of temperature changes undergone by the fluid). Furthermore, the coolant passes by many micropin/fins 115 (an example of a cross-flow through micropin/fins is shown in FIG. 7, the purpose of which would be similar in a radial flow configuration), which increase the heat transfer surface area and promote flow mixing, thus enhancing heat transfer. Then, the coolant exits the microgap 114, and collects in the outlet plenum 116, which surrounds the entire outer perimeter of the microgap plate 102. The collected coolant then flows out of the device 100 through the side outlet 111.

The backend of the cooling system is a standard fluid loop for circulating the coolant. Typically, this loop connects the microgap cooling device to, at a minimum, a pump to circulate the coolant, and a second heat transfer device (usually a radiator) to expel heat from the coolant to the environment, and, in the case of two-phase cooling, condense the coolant vapor back to its liquid state. This backend could also be a refrigeration-style fluid loop.

Figure 4:
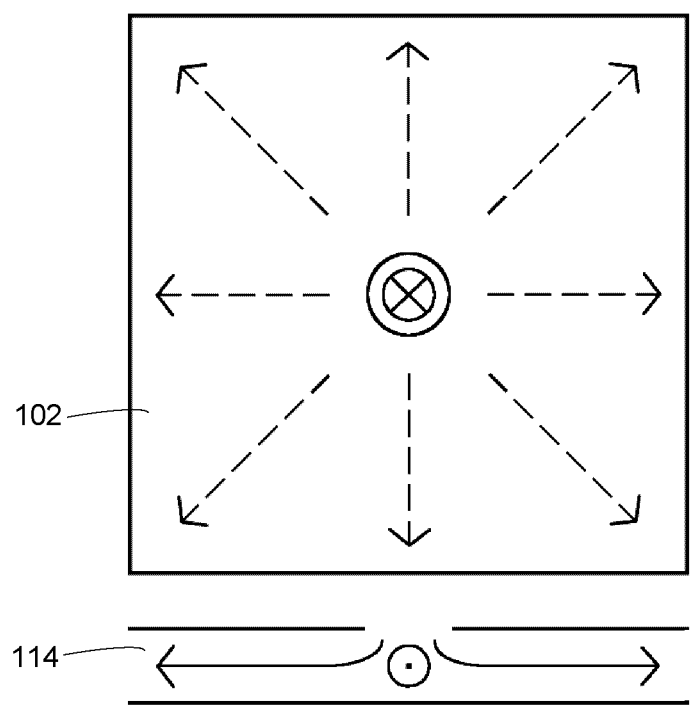
FIG. 4 is a top view illustrating a configuration with a central inlet radial flow, according to an embodiment of the invention.
Figure 5:
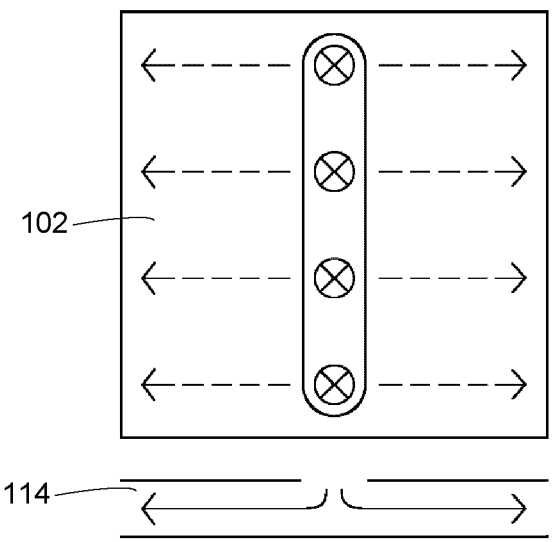
FIG. 5 is a top view illustrating a configuration with a central inlet radial flow, according to an embodiment of the invention.

The device can provide other flow configurations than the one shown in FIG. 4 which is implemented in the device 100 of FIG. 1. For example, FIGS. 5, 6 and 7 show other flow configurations.

Now referring to one of such other embodiments as shown in FIG. 5, the microgap plate can have a central spanwise inlet slit, about a middle line of the lid instead of a single central inlet in the middle of the lid, to create a split flow configuration.

Figure 3:
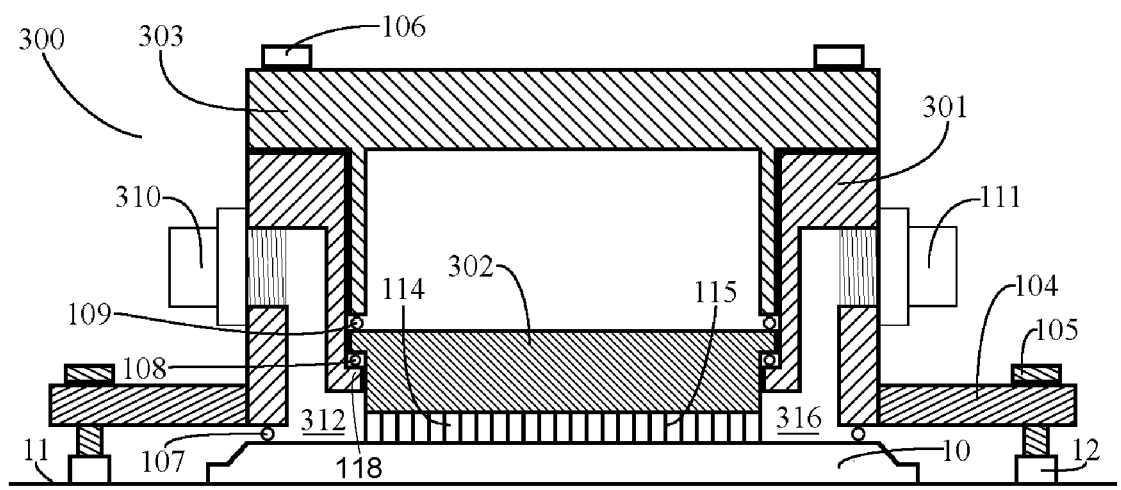
FIG. 3 is a side cross-section illustrating a device for cooling comprising a side inlet microgap and micropin/fins, according to an embodiment of the invention.
Figure 6:
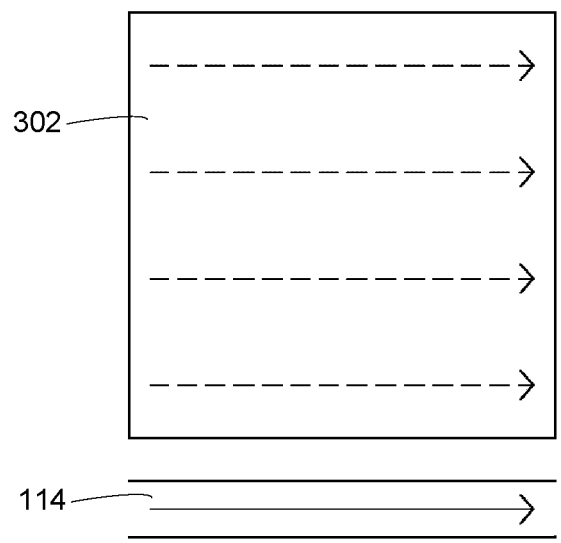
FIG. 6 is a top view illustrating a configuration with a side inlet cross flow, according to an embodiment of the invention.

FIG. 6 shows a cross-flow configuration. FIG. 3 illustrates with more detail an alternative embodiment which implements such a cross-flow configuration for the device 300. In this case, the lid 303 does not contain the central inlet (as in FIG. 1), and there is instead a side inlet 310 on the side wall opposite to the side wall with the side outlet 111 of the chamber 301. In this embodiment, the incoming coolant flows into a side inlet plenum 312, and flows through the microgap in a cross-flow manner, as shown schematically in FIG. 6. A microgap plate 302 again creates the microgap 114, but it does not have a central inlet (i.e., it does not need one as shown in FIG. 3 because the inlet 310 is on the side instead). The coolant flows out of the microgap 114 into a side outlet plenum 316 before exiting the device through the side outlet 111.

FIG. 7 shows schematically how the micropin/fins can be implemented in a cross-flow configuration such as in FIG. 6.

Figure 8:
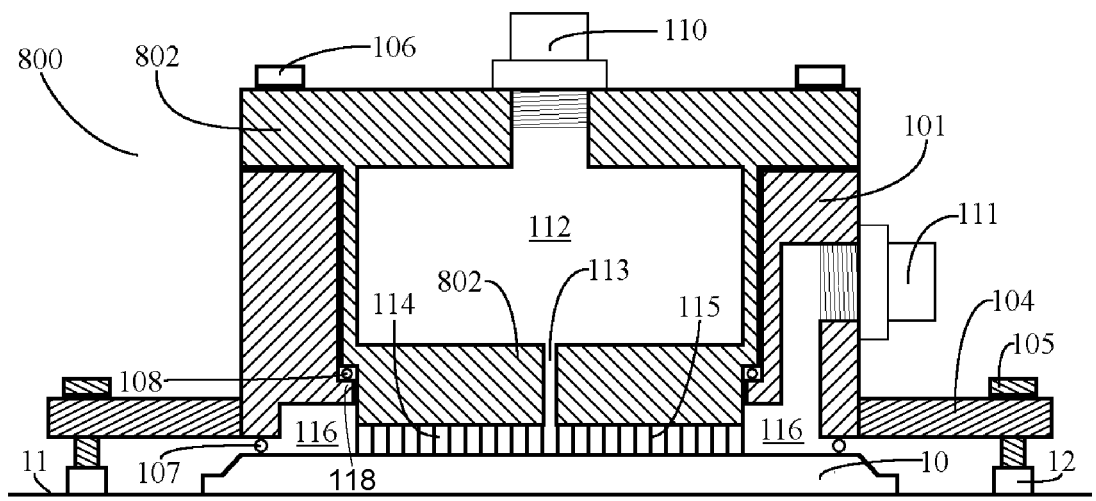
FIG. 8 is a side cross-section illustrating a device for cooling comprising a central inlet microgap in a two-piece device configuration, according to an embodiment of the invention.

Now referring to another embodiment of the device 800, shown in FIG. 8, the lid and the microgap plate are integrally formed by a single piece 802. This embodiment still provides a simple and safe removal procedure that does not risk spillage of coolant. However, it is slightly more difficult to clean and maintain, and would also be more difficult to manufacture.

Figure 9:
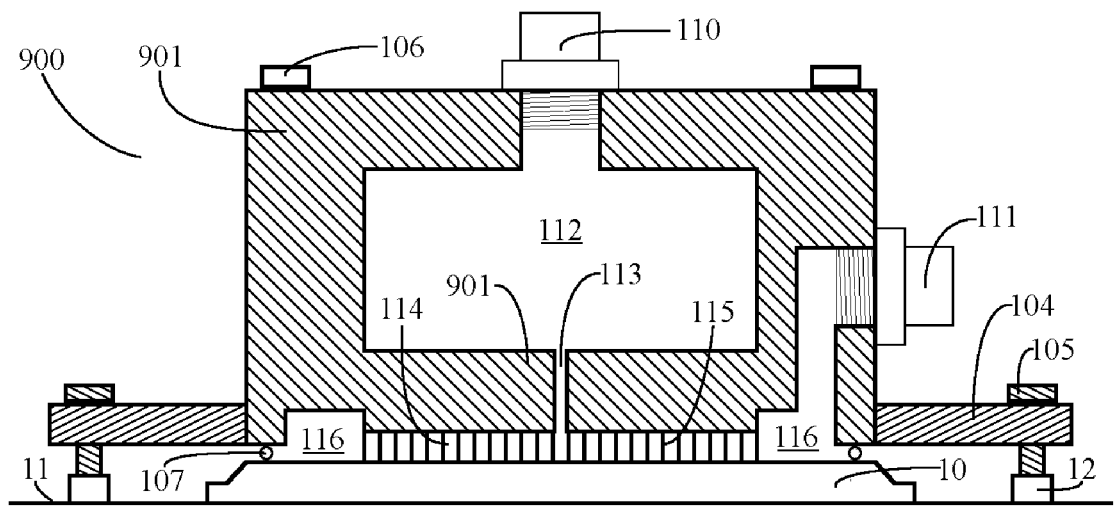
FIG. 9 is a side cross-section illustrating a device for cooling comprising a central inlet microgap in a single-piece device configuration, according to an embodiment of the invention.

Referring to FIG. 9, another embodiment of the device 900 is shown in which the chamber, the microgap plate and the lid have all been combined into a single piece 901. Compared to the three-piece embodiment shown for example in FIG. 1, this one-piece embodiment lacks the ease of cleaning, maintenance, removal and manufacturing. However, there are fewer sealing members required in the one-piece embodiment, thus limiting leakage potential during operation. The required trade-off between these features should guide the design choice between the three-piece or one-piece embodiments when making the device.

Although micropin/fins are used in the primary embodiment of the present invention, it would be possible to use any other type of heat transfer enhancement structure or coating on the microgap plate, such as microchannels, while maintaining a similar level of practicality. Furthermore, it would be possible to omit a heat transfer enhancement altogether and simply use a bare microgap. In the case of a bare microgap, some standoff structures (e.g., micropins) would still be necessary to impose the desired microgap height.

It should be noted that additional flow configurations may be possible with these embodiments. The inlet and outlet may be reversed (e.g., inlet from the side of the chamber and the outlet at the center of the microgap). Or, multiple inlets or outlets may be used (e.g., central and side inlets with a side outlet or central inlet with two side outlets).

While preferred embodiments have been described above and illustrated in the accompanying drawings, it will be evident to those skilled in the art that modifications may be made without departing from this disclosure. Many variations of the device are possible by combining features of the described embodiments Such modifications are considered as possible variants comprised in the scope of the disclosure.

The invention claimed is:

1. A device for cooling a processor, the device comprising:
   a chamber which is bottomless and has a perimeter sealably mounted directly on a surface of the processor;
   a microgap plate, separate from the chamber, which is installed at a bottom of the chamber and forms a microgap with the surface of the processor, comprising micropins/fins maintaining the height of the microgap; and
   a lid, separate from the chamber, which is installed onto the chamber to close a top of the chamber, the lid comprising downward projections to urge the microgap plate to the bottom of the chamber during installation;
   wherein the lid and the downward projections thereof, when assembled together, form a bottomless enclosure, with an inlet and outlet thereof, which defines an inlet plenum volume for receiving coolant, the inlet plenum volume being distinct from the microgap.

2. The device of claim 1, wherein the downward projections of the lid comprise side walls.

3. The device of claim 2, wherein the side walls of the downward projections of the lid are joined at edges thereof and form a lining conforming to an inner surface of walls of the chamber.

4. The device of claim 3, wherein the lid further comprises a central inlet which opens to the inlet plenum volume.

5. The device of claim 3, wherein the chamber comprises a seat in a bottom portion of the chamber, the seat protruding inwardly from the inner surface of walls of the chamber, the microgap plate being seated on said seat.

6. The device of claim 5, further comprising another internal sealing member at an interface between the seat and a portion of the microgap plate seated on the seat.

7. The device of claim 1, further comprising an internal sealing member at an interface between bottom edges of the downward projections of the lid and a portion of the microgap plate onto which said downward projections of the lid urge.

8. The device of claim 1, wherein the lid further comprises a central inlet which opens to the inlet plenum volume, within the lid and the downward projections thereof.

9. The device of claim 1, further comprising the central inlet in the lid providing an inlet for coolant into the chamber and into side outlet plenums in opposite side walls of the chamber providing an outlet for the coolant from the microgap.

10. A device for cooling a processor, the device comprising:
- a chamber which is bottomless and has a perimeter sealably mounted directly on a surface of the processor;
- a microgap plate, separate from the chamber, which is installed at a bottom of the chamber and forms a microgap with the surface of the processor, comprising micropins/fins maintaining the height of the microgap; and
- a lid, separate from the chamber, which is installed onto the chamber to close a top of the chamber, the lid comprising downward projections to urge the microgap plate to the bottom of the chamber during installation;
- wherein the lid and the downward projections thereof, when assembled together, form a bottomless enclosure which defines a plenum volume, the plenum volume being distinct from the microgap, further comprising a side inlet plenum and a side outlet plenum in opposite side walls of the chamber for coolant inlet in the microgap and coolant outlet from the microgap, respectively.

11. A device for cooling a processor, the device comprising:
- a chamber which is bottomless and has a perimeter sealably mounted directly on a surface of the processor;
- a microgap plate, separate from the chamber, which is installed at a bottom of the chamber and forms a microgap with the surface of the processor; and
- a lid, separate from the chamber, which is installed onto the chamber to close a top of the chamber, the lid comprising downward projections to urge the microgap plate to the bottom of the chamber during installation; micropin/fins at a bottom of the microgap plate to enhance heat transfer in the microgap, wherein the micropin/fins extend downwardly from a bottom of the microgap plate, the micropins/fins occupying the entire height and maintaining the height above the surface of the processor.

12. The device of claim 11, wherein the downward projections of the lid comprise side walls.

13. The device of claim 12, wherein the side walls of the downward projections of the lid are joined at edges thereof and form a lining conforming to an inner surface of walls of the chamber, wherein the lid and the downward projections thereof together form a bottomless enclosure.

14. The device of claim 13, wherein the bottomless enclosure formed by the lid and the downward projections thereof defines an inlet plenum volume for receiving coolant.

15. The device of claim 14, wherein the lid further comprises a central inlet which opens to the inlet plenum volume.

16. The device of claim 15, wherein the microgap plate comprises a microgap central inlet permitting flow of coolant between the inlet plenum volume and the microgap.

17. The device of claim 13, wherein the chamber comprises a seat in a bottom portion of the chamber, the seat protruding inwardly from the inner surface of walls of the chamber, the microgap plate being seated on said seat.

18. The device of claim 11, further comprising an internal sealing member at an interface between bottom edges of the downward projections of the lid and a portion of the microgap plate onto which said downward projections of the lid urge.

19. The device of claim 11, wherein the lid further comprises the central inlet which opens to an inside volume of the chamber, within the lid and the downward projections thereof.

20. The device of claim 11, further comprising the central inlet in the lid providing an inlet for coolant into the chamber and into side outlet plenums in opposite side walls of the chamber providing an outlet for the coolant from the microgap.

* * * * *